(12) United States Patent
Kwong

(10) Patent No.: US 7,068,091 B1
(45) Date of Patent: Jun. 27, 2006

(54) VOLTAGE TRANSLATOR CIRCUIT FORMED USING LOW VOLTAGE TRANSISTORS

(75) Inventor: David Kwong, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/376,056

(22) Filed: Feb. 27, 2003

(51) Int. Cl.
*H03L 5/00* (2006.01)

(52) U.S. Cl. ........................................ 327/333
(58) Field of Classification Search ........... 326/80, 326/81; 327/318, 319, 333
See application file for complete search history.

(56) References Cited

U.S. PATENT DOCUMENTS

| | | | |
|---|---|---|---|
| 4,978,905 A | 12/1990 | Hoff et al. | |
| 5,157,282 A | 10/1992 | Ong et al. | |
| 5,502,405 A | 3/1996 | Williams | |
| 5,600,267 A | 2/1997 | Wong et al. | |
| 5,745,354 A | 4/1998 | Raza | |
| 5,872,464 A | 2/1999 | Gradinariu | |
| 5,952,868 A | 9/1999 | Gowni et al. | |
| 5,973,545 A | 10/1999 | Raza | |
| 6,011,421 A | 1/2000 | Jung | |
| 6,590,420 B1 | 12/2001 | Mnich et al. | |
| 6,362,652 B1 * | 3/2002 | Oner et al. | 326/81 |
| 6,366,124 B1 | 4/2002 | Kwong | |
| 6,370,071 B1 * | 4/2002 | Lall et al. | 365/205 |
| 6,377,075 B1 * | 4/2002 | Wong | 326/83 |
| 6,392,440 B1 * | 5/2002 | Nebel | 326/81 |
| 6,404,229 B1 | 6/2002 | Barnes | |
| 6,407,579 B1 * | 6/2002 | Goswick | 326/81 |
| 6,429,716 B1 * | 8/2002 | Drapkin et al. | 327/333 |
| 6,518,818 B1 * | 2/2003 | Hynes | 327/333 |
| 6,580,291 B1 * | 6/2003 | Lutley | 326/81 |

* cited by examiner

*Primary Examiner*—Jeffrey Zweizig
(74) *Attorney, Agent, or Firm*—Brownstein Hyatt & Farber, P.C.

(57) ABSTRACT

A circuit for use in conjunction with a portion of a core of an integrated circuit, for shifting a signal from a first voltage level to a second voltage level, wherein the circuit is formed using the same process type transistors (i.e., low voltage transistors) as are used in the core of the integrated circuit.

18 Claims, 3 Drawing Sheets

VOLTAGE TRANSLATOR CIRCUIT FORMED USING LOW VOLTAGE TRANSISTORS

FIELD OF THE INVENTION

This invention relates to level shifting or voltage translating circuits.

BACKGROUND OF THE INVENTION

In the design of integrated circuits, the voltages representative of logic signals at the core of the integrated circuit are often lower than the voltage levels associated with logic signals used by input/output (I/O) sections of the integrated circuit or devices external to the integrated circuit. Accordingly, level shifting circuits or voltage translating circuits are used to shift or translate voltage signals representative of logic levels or data at the core of the integrated circuit to higher voltage levels representative of the same data for use with I/O circuit sections or output devices.

For instance, microprocessors, programmable logic devices, memory devices, timing and clock devices or circuits, all contain I/O interfaces which operate at different voltage levels than the core of the respective integrated circuit. In one example, a core logic voltage level may be zero to 1.8 volts, wherein zero volts is representative of "low" signal, and 1.8 volts is representative of a "high" logic signal. Alternatively, a "high" logic signal may be represented as, for instance, 2.5 volts at the core. These logic levels at the core of the integrated circuit are translated using level shifting circuits or voltage translators to higher voltage levels, such as, in one example, zero to 3.3 volts, wherein zero volts represents a logic "low" level, and 3.3 volts represents a logic "high" level.

FIG. 1 illustrates an example of a voltage translating circuit 10 which can be used with an integrated circuit having a core. An integrated circuit including the circuit of FIG. 1 uses two different types of transistors (known as dual gate IC process technology), one transistor type with a high voltage oxide gate breakdown (i.e., high voltage transistors) for the level shifting circuit 10, and another transistor type with a low voltage oxide gate breakdown (i.e., low voltage transistors) used in the core.

Referring to FIG. 1, circuit 10 uses high voltage transistors including a p-channel transistor 12 in parallel with a p-channel transistor 14 having its gate coupled with the drains of the parallel connection of p-channel transistors 16 and 18, wherein the gate of transistor 16 is coupled with the drains of transistors 12 and 14. N-channel transistors 20 and 22 have their drains connected to the drains of parallel transistors 12 and 14 and parallel transistors 16 and 18, respectively. The gate of transistor 20 receives input data from the core of the integrated circuit, while the gate of transistor 22 receives through inverter 24 the complement of the input data signal from the core. In this circuit, an output signal may be taken from the drain of transistor 22, while the complement of the output signal may be taken from the drain of transistor 20.

In operation, when the input data signal 25 is low, transistor 20 turns off which allows the drain of transistor 20 to float. Because the input data signal 25 is low, inverter 24 provides a high signal to the gate of transistor 22, and transistor 22 is on and the output signal 26 goes low, which turns transistor 14 on, which charges up the output complement signal 28 to a high level. The high level on the complement output signal 28 also turns transistor 16 off which allows transistor 22 to pull or hold output signal 26 at a low logic level.

When the input data signal 25 from the core is at a high logic level, this turns transistor 22 off and allows the output signal 26 to float. Transistor 20 is on, and accordingly, the output signal 28 is at a low logic level, which turns transistor 16 on which charges up the output signal 26 to a high logic level, which turns transistor 14 off, thereby allowing transistor 20 to pull down the output signal 28 to a logic low level.

In the example of FIG. 1, the core of the integrated circuit may use low voltage oxide gate breakdown transistors, and the circuit 10 may utilize high voltage oxide gate breakdown transistors for performing the level shifting operations.

However, as recognized by the present inventor, forming an integrated circuit through the use of dual gate IC processes increases the complexity and cost of the integrated circuit design. Further, the circuit 10 of FIG. 1 draws standby current even when the circuit is not translating or switching, and general reductions in the standby current have a tendency to slow down the operation of the translating circuit, which is undesirable for high performance, low power applications.

Further, as recognized by the present inventor, an integrated circuit formed using dual gate IC designs may not in some instances be easily adaptable or portable to different circuit I/O supply environments or designs, since the output 26 of circuit 10 may be sensitive to the width ratios of transistors 18 and 22 or 12 and 20, in one example. Furthermore, as recognized by the present inventor, in dual gate integrated circuit processes, there may be a tradeoff between the long term reliability of the voltage translating circuit and the speed of the switching of the translating circuit because larger signal swings are desirable for faster translation speeds; however, such larger signals swings may degrade the long term reliability of the device by imposing an unacceptably high level of voltage stress on switching elements of the translating circuit.

As recognized by the present inventors, what is needed is a circuit for shifting the voltage levels of an input signal to higher voltage levels, wherein the circuit is formed using the same process/type of transistors as is used in the core of the integrated circuit.

It is against this background that various embodiments of the present invention were developed.

SUMMARY

According to one broad aspect of one embodiment of the invention, disclosed herein is a circuit for use in conjunction with a portion of a core of an integrated circuit, for shifting a signal from a first voltage level to a second voltage level wherein the circuit is formed using the same process type of transistors (i.e., low voltage transistors) as are used in the core of the integrated circuit. In this manner, an integrated circuit may be formed in one example having a core and a level shifting circuit wherein the core and the level shifting circuit use only transistors of single IC process technology (i.e., low voltage transistors).

According to another broad aspect of an embodiment of the invention, disclosed herein is an integrated circuit comprising a core portion including a plurality of transistors made using a first process technology and a level shifting circuit, wherein said level shifting portion includes transistors made only using the first process technology. In one embodiment, the plurality of transistors includes low voltage transistors or transistors having gate oxide layers having low breakdown voltages. A pulse generating circuit may be included for momentarily activating a portion of the transistors of the level shifting circuit, thereby reducing the amount of power consumed by the level shifting circuit. Further, a cascode circuit may be provided for receiving an output of the level shifting circuit.

According to another broad aspect on an embodiment of the invention, disclosed herein is an integrated circuit including a core portion including a plurality of low voltage transistors and a level shifting circuit, wherein said level shifting portion includes only low voltage transistors.

According to another broad aspect on an embodiment of the invention, disclosed herein is an integrated circuit having a core formed using low voltage transistors, a circuit for shifting a signal from the core at a first voltage level, to a second voltage level. In one example, the circuit includes a first switch having a control coupled with the signal, the first switch having an output; a second switch having a control coupled with an inverted representation of the signal, the second switch having an output; a third switch having a control coupled with the output of the second switch, the third switch having an output; a fourth switch having a control coupled with the output of the first switch, the fourth switch having an output; a first pulse generator receiving the signal and generating an output pulse signal; a fifth switch having a control coupled with the output pulse signal of the first output pulse generator and an output coupled with the output of the first switch; a second pulse generator receiving the inverted representation of the signal and generating an output pulse signal; and a sixth switch having a control coupled with the output pulse signal of the second pulse generator and an output coupled with the output of the first switch.

The features, utilities and advantages of the various embodiments of the invention will be apparent from the following more particular description of embodiments of the invention as illustrated in the accompanying drawings.

DETAILED DESCRIPTION

Figure 2:
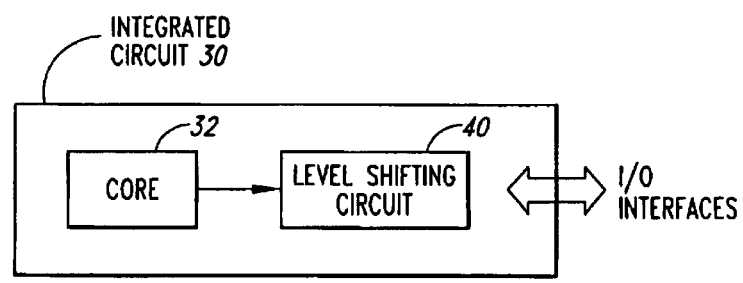
FIG. 2 illustrates an integrated circuit including a level shifting circuit formed using low voltage transistors, in accordance with an embodiment of the present invention.

FIG. 2 illustrates an integrated circuit 30 having a core 32 and a voltage translating or level shifting circuit 40, in accordance with an embodiment of the present invention. Preferably, the core 32 of integrated circuit 30 may include memory, logic, programmable logic, microprocessors or microcontrollers or portions thereof, timing or clock portions or other circuit or functional blocks therein. In order to reduce the power dissipation of the core, the circuits or elements of the core are made using low voltage transistors or switching elements. Low voltage transistors include, for example, transistors having a gate oxide with a lower breakdown voltage (i.e., a thinner gate) that the other transistors, such as high voltage transistors, which have a higher breakdown voltage (i.e., a thicker gate) and which may dissipate greater amounts of power during normal operation. Lower voltage transistors have characteristics such as low power consumption when compared with other transistors such as high voltage transistors.

In one example, low voltage transistors may include transistors supporting a maximum supply voltage of approximately 1.8 volts or less. In another example, low voltage transistors may include transistors having a gate oxide layer of approximately 32 Angstroms in thickness or less. In another example, low voltage transistors may include transistors having a maximum gate-to-source voltage, drain-to-source, or gate-to-drain voltage of approximately 1.8 volts or less. In one example, high voltage transistors may include transistors supporting a maximum supply voltage of approximately 3.3 volts. In another example, high voltage transistors may include transistors having a gate oxide layer of approximately 85 Angstroms in thickness. In another example, high voltage transistors may include transistors having a maximum gate-to-source voltage, drain-to-source, or gate-to-drain voltage of approximately 3.3 volts.

Figure 1:
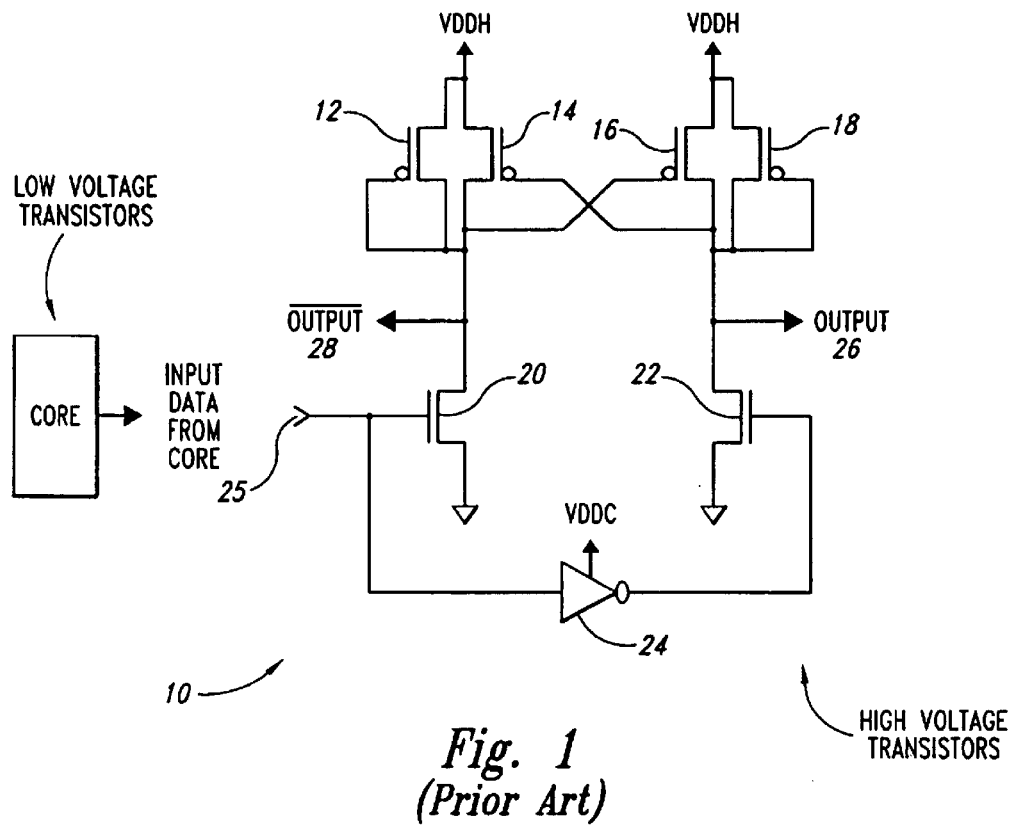
FIG. 1 illustrates a level shifting circuit for shifting the level of the input signal 25 to a greater level at signal output 26.

In accordance with an embodiment of the present invention, integrated circuit 30 is provided with a level shifting circuit 40, wherein the level shifting circuit 40 is made using low voltage transistors with low power dissipation characteristics, such as the transistors used in the core 32 of integrated circuit 30. Preferably, level shifting circuit 40 is made using only low voltage transistors that are made or formed using the same process technology as the transistors used in the core 32 of integrated circuit 30. In this manner, by providing a level shifting circuit 40 utilizing the same type of low voltage transistors as are used in core 32, the overall integrated circuit 30 exhibits a lower power consumption characteristic when compared with integrated circuits that utilize high voltage transistors for the level shifting circuit portions as in FIG. 1 described above. Various embodiments of integrated circuit 30 and level shifting circuit 34 will now be described.

Figure 3:
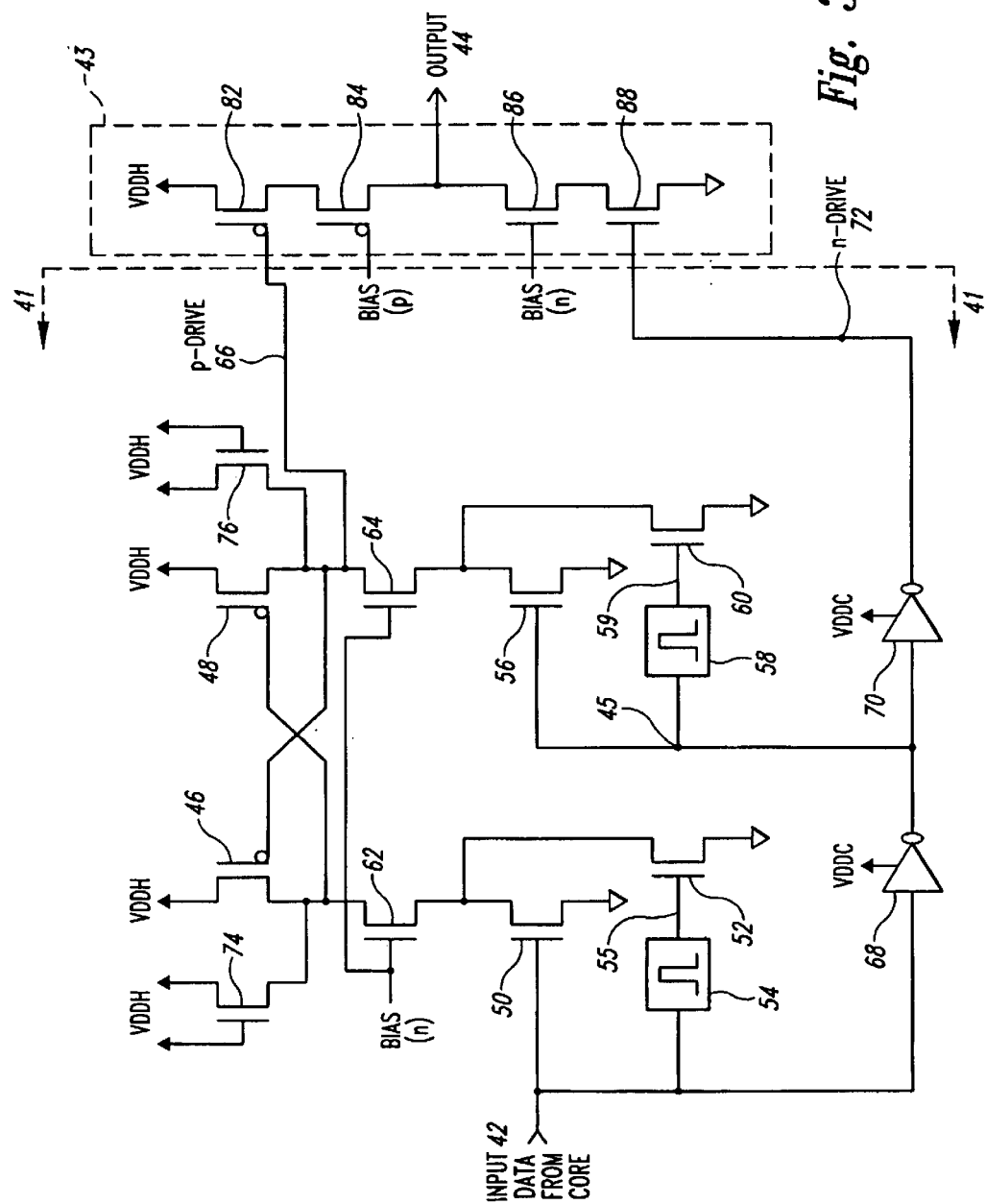
FIG. 3 illustrates an example of a level shifting circuit for shifting an input signal 42 to a greater voltage level at output signal 44, in accordance with one embodiment of the present invention.

FIG. 3 illustrates a circuit 40 for translating or shifting a data signal 42 from a first voltage level from a core of an integrated circuit to a output signal 44 at a second voltage level, in accordance with one embodiment of the present invention. In one example, the output signal 44 is at voltage levels greater that the core voltage levels present at input data signal 42. In this way, the output signal 44 may be used to drive input/output (I/O) circuitry or other circuitry, at logic high levels of for example, 2.5 volts or 3.3 volts.

For example, in one embodiment, an input data signal 42 may range in voltage from zero to 1.8 volts, while the output signal 44 may have a voltage range of zero to 2.5 volts or zero to 3.3 volts. In another example, the core supply voltage may be approximately 2.5 volts, and the high I/O supply voltage (VDDH) may be approximately 3.3 volts. In FIG. 3, VDDC represents the core voltage (i.e., approximately 1.8 volts in one example) and VDDH represents the I/O supply voltage (i.e., approximately 2.5 volts or 3.3 volts as examples). The particular voltage levels used at the core 42 or at the output 44 are a matter of choice depending upon the particular implementation, and it is understood that the circuit 40 could be used in various environments to shift the logic levels of an input data signal 42 to a higher logic level at output signal 44.

In one example, the transistors shown herein may be CMOS transistors, BIGMOS transistors, or bipolar transistors. As used herein, the term "transistor" or "switch" includes any switching element which can include, for example, n-channel or p-channel CMOS transistors, MOSFETs, FETs, JFETS, BJTs, or other like switching element or device. The particular type of switching element used is a matter of choice depending on the particular application of the circuit, and may be based on factors such as power consumption limits, response time, noise immunity, fabrication considerations, etc. Hence while embodiments of the present invention are described in terms of p-channel and n-channel transistors, it is understood that other switching devices or switching elements can be used.

Figure 4:
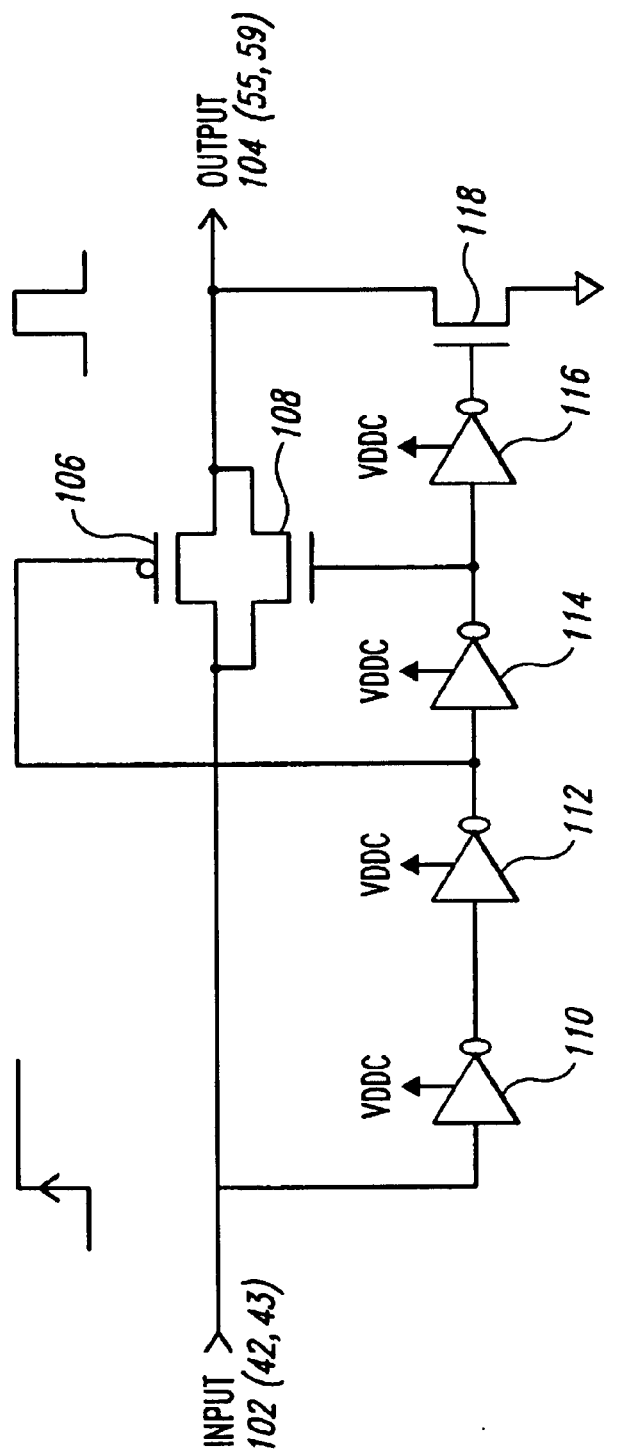
FIG. 4 illustrates a circuit for converting a transition of an input signal to a pulse, in accordance with one embodiment of the present invention.

Preferably and in accordance with an embodiment of the present invention, the circuits of FIGS. 3–4 are formed using the same low voltage transistors that are used in the core of the integrated circuit, thereby reducing the cost and process complexity in forming the integrated circuit as well as improving the power consumption characteristic of the overall integrated circuit.

In FIG. 3, circuit 40 includes a plurality of n-channel and p-channel transistors, along with circuits 54 and 58 whose details are illustrated in FIG. 4. In one example, the circuit 40 includes a translating portion 41 and a cascode or pad drive portion 43. The elements contained within the dashed block 43 form a pad driver or cascode circuit which provide an output signal 44 that may be used to control or may be coupled with an off-chip integrated circuit or interface.

P-channel transistors 46 and 48 have their sources coupled to VDDH, and the gate of transistor 46 is coupled to the drain of transistor 48, and the gate of transistor 48 is coupled to the drain of transistor 46.

Input data signal 42 is coupled with the gate of n-channel transistor 50, having its drain coupled with the drain of n-channel transistor 52. Input data signal 42 also drives the input to circuit 54, and the output 55 drives the gate of n-channel transistor 52. Input data signal 42 is inverted through inverter 68 to form signal 45 which is coupled with the gate of n-channel transistor 56 as well as the input to circuit 58. The output 59 of circuit 58 is coupled with the gate of n-channel transistor 60, whose drain is coupled with the drain of n-channel transistor 56. The output 45 of inverter 68 is inverted through inverter 70 to form a drive signal 72 (shown as n-drive 72) which drives the n-channel transistor 88 of the cascode circuit 43. In one example, inverters 68, 70 are referenced to the core supply VDDC.

N-channel transistor 62 has its source coupled with the drain of n-channel transistor 50. The gate of transistor 62 is coupled with the gate of n-channel transistor 64, transistor 64 having its source coupled to the drain of transistor 56. Both gates of transistor 62, 64, are coupled with the n-bias signal. Transistors 62 and 64 are on during normal operation and shield transistors 50 and 56 from any high swings of VDDH. The bias signals (p) and (n) shown in FIG. 3 are preferably one-half of VDDH, and help insure that transistors 82 and 88 see the full extent of the signal VDDH.

The drain of transistor 62 is coupled with the drain of transistor 46 (which is also coupled with the gate of transistor 48). The drain of transistor 64 is coupled with the drain of transistor 48 (which is also coupled with the gate of transistor 46).

In one example, n-channel transistors 74 and 76 are provided in parallel with transistors 46 and 48, respectively, wherein the source of transistor 74 is coupled with the drain of transistor 46 and the gate and drain of transistor 74 are coupled to VDDH. The source of transistor 76 is coupled with the drain of transistor 48, and the drain and gate of transistor 76 are coupled to VDDH. Generally, transistors 74 and 76 are on during normal operation and clamp low level signals so that the low level logic signals do not go below ground or go too low to exceed the breakdown of transistor 86 (i.e., transistor 86 will not exceed the breakdown voltage). Alternatively, pull up resistors may be substituted in place of transistors 74, 76.

Cascode circuit 43 is formed, in one example, through the series connection of p-channel transistor 82 having its source coupled to the high I/O supply voltage VDDH and its drain coupled with the source of p-channel transistor 84. P-channel transistor 84 has its gate coupled with a bias voltage, preferably one half of VDDH, and its drain coupled with the drain of n-channel transistor 86. N-channel transistor 86 has its gate coupled to a bias voltage of, in one example, one-half of VDDH, and its source coupled with the drain of n-channel transistor 88. The cascode circuit 43 receives a p-drive signal 66 and a n-drive signal 72, which respectively are coupled to the gates of transistors 82 and 88 to control the logic level of the output signal 44.

In operation, when data signal 42 is high, transistors 50 and 52 are on; therefore, the drain of transistor 50 goes to a low logic level, thereby turning transistor 48 on (since transistor 62 is on during normal operations). The input signal 42 is inverted through inverter 68 thereby turning transistor 56 off, as well as providing a low signal 45 to circuit 58, which turns transistor 60 off. Because neither transistors 56 or 60 are pulling down the source of transistor 64 (which is on during normal operations) the p-drive signal 66 can go high through transistors 76 and 48, and accordingly, the gate of transistor 46 goes high which turns transistor 46 off. Since the p-drive signal 66 is high, and because the n-drive signal 72 is high thereby turning on transistor 88, the output signal 44 is low.

When data signal 42 goes low, transistors 56 and 60 turn on, and accordingly, the p-drive signal 66 goes low. However, the p-drive signal 66 does not go all the way to ground because of transistor 76 which is ordinarily on during normal operation. As the p-drive signal 66 goes low, this turns off transistor 60 through circuit 58, thereby reducing the standby current consumed by transistor 60. In one example, the reduction of standby current through transistor 60 is approximately one-half of the standby current through, for instance, transistor 22 of the FIG. 1.

After transistor 60 is turned off, the p-drive signal 66 will rise a bit but will still be within the logic low levels. Accordingly, the strain on transistor 82 from the voltage applied between the gate and source is reduced while maintaining transistor 82 in an on condition. In this manner, the strain on transistor 82 is reduced while proper operation of the circuit is still maintained. Since transistor 88 is off and transistor 82 is on, the output signal 44 goes to a high logic level.

Accordingly, when the data signal 42 goes low, transistors 56 and 60 turn on at the same time and the p-drive signal 66 goes low. For a faster response, a larger pair of transistors 56, 60 may be used at the expense of a greater amount of standby current consumption. Once the p-drive signal 66 goes low, the transistor 60 is turned off which reduces standby current of the transistors 56, 60 by approximately one-half of the amount that transistor 60 was drawing during operation. After transistor 60 has been turned off, the p-drive signal 66 will rise, thereby reducing the gate source voltage strain on cascode transistor 82 which improves the long term reliability of the overall circuits while still keeping transistor 82 on.

FIG. 4 illustrates a circuit for generating pulses to momentarily turn on n-channel transistors 52 and 60 of FIG. 3, in accordance with one embodiment of the present invention. The circuit 100 shown in FIG. 4 receives an input 102 and provides an output 104, and in one embodiment, the circuit 100 can be used as circuit 54 in FIG. 3 receiving input 42 and providing output 55, or may be used as circuit 58 in FIG. 3 receiving input 43 and providing output 59.

As shown in FIG. 4, circuit 100 includes an inverter 110 receiving the input signal 102 and providing its output coupled to the input of inverter 112. The output of inverter 112 is coupled to the input of inverter 114 whose output is coupled to the output of inverter 116. The output of inverter 116 is coupled with the gate of an n-channel transistor 118, having its source coupled to ground and its drain coupled with output signal 104. The input signal 102 is coupled with a p-channel transistor 106 connected in parallel with an n-channel transistor 108. In one embodiment, the p-channel transistor 106 has its gate coupled to the output of inverter 112, its drain coupled to input 102, and its source coupled to output 104. In one example, the n-channel transistor 108 has its gate coupled to the output of inverter 114, and its source coupled with the input signal 102 and its drain coupled with the output signal 104. In operation, when the input signal 102 is low, both transistors 106 and 108 are on and transistor 118 is off such that the output 104 can track the input signal and is also at a low logic level. When the input signal 102 goes high, the output signal 104 initially tracks the input signal since transistors 106 and 108 were previously on, and accordingly the output signal 104 goes high. After some delay (i.e., the delay associated with four logic gates), transistor 106 and transistor 108 both turn off and transistor 118 turns on which pulls output signal 104 to a low logic level. Accordingly, the circuit of FIG. 4 converts a transition of the input 102 from a low to a high logic level into a pulse present at output 104.

In accordance with one embodiment of the present invention, the circuit 40 and the circuit 100 are formed using the same low voltage transistors that are used in the core of the integrated circuit thereby reducing the cost and process complexity in forming the integrated circuit. Accordingly, an integrated circuit can be implemented using a single gate process technology (i.e., using standard low voltage technologies) and, when used with the level shifting circuits of the present invention, permits low power, high speed implementations.

While the invention has been particularly shown and described with reference to embodiments thereof, it will be understood by those skilled in the art that various other changes in the form and details may be made without departing from the spirit and scope of the invention. For instance, while FIGS. 3–4 show and describe transistors 46, 48 as p-channel transistors and transistors 50, 56 as n-channel transistors, one or more of these or other transistors could be substituted with a complementary transistor (i.e., n-channel in place of p-channel) without departing from the scope of embodiments of this invention.

What is claimed is:

1. An integrated circuit, comprising:
   a core portion including a plurality of transistors made using a first process technology; and
   a level shifting circuit, wherein said level shifting portion includes transistors made only using the first process technology;
   wherein the level shifting circuit further comprises a pulse generating circuit for momentarily activating a portion of the transistors of the level shifting circuit, thereby reducing the amount of power consumed by the level shifting circuit.

2. The integrated circuit of claim 1, wherein the plurality of transistors includes low voltage transistors.

3. The integrated circuit of claim 1, wherein the plurality of transistors includes transistors having gate oxide layers having low breakdown voltages.

4. The integrated circuit of claim 1, further comprising:
   a cascode circuit receiving an output of the level shifting circuit.

5. An integrated circuit, comprising:
   a core portion including a plurality of transistors made using a first process technology; and
   a level shifting circuit, wherein said level shifting portion includes transistors made only using the first process technology, wherein the level shifting circuit includes:
   a first switch having a control coupled with the signal, the first switch having an output;
   a second switch having a control coupled with an inverted representation of the signal, the second switch having an output;
   a third switch having a control coupled with the output of the second switch, the third switch having an output;
   a fourth switch having a control coupled with the output of the first switch, the fourth switch having an output;
   a first pulse generator receiving the signal and generating an output pulse signal;
   a fifth switch having a control coupled with the output pulse signal of the first output pulse generator and an output coupled with the output of the first switch;
   a second pulse generator receiving the inverted representation of the signal and generating an output pulse signal; and
   a sixth switch having a control coupled with the output pulse signal of the second pulse generator and an output coupled with the output of the first switch.

6. An integrated circuit, comprising:
   a core portion including a plurality of low voltage transistors; and
   a level shifting circuit, wherein said level shifting portion includes only low voltage transistors, wherein the level shifting circuit further comprises:
   a pulse generating circuit for momentarily activating a portion of the transistors of the level shifting circuit, thereby reducing the amount of power consumed by the level shifting circuit.

7. The integrated circuit of claim 6, wherein the plurality of transistors includes transistors having gate oxide layers having low breakdown voltages.

8. The integrated circuit of claim 6, further comprising:
   a cascode circuit receiving an output of the level shifting circuit.

9. In a integrated circuit having a core formed using low voltage transistors, a circuit for shifting a signal from the core at a first voltage level, to a second voltage level, the circuit comprising:
   a first switch having a control coupled with the signal, the first switch having an output;
   a second switch having a control coupled with an inverted representation of the signal, the second switch having an output;
   a third switch having a control coupled with the output of the second switch, the third switch having an output;

a fourth switch having a control coupled with the output of the first switch, the fourth switch having an output;

a first pulse generator receiving the signal and generating an output pulse signal;

a fifth switch having a control coupled with the output pulse signal of the first output pulse generator and an output coupled with the output of the first switch;

a second pulse generator receiving the inverted representation of the signal and generating an output pulse signal; and a sixth switch having a control coupled with the output pulse signal of the second pulse generator and an output coupled with the output of the first switch.

10. The circuit of claim 9, wherein the first, second, third, fourth, fifth and sixth switches are formed using low voltage transistors.

11. The circuit of claim 9, wherein the first switch is an n-channel transistor.

12. The circuit of claim 9, wherein the second switch is an n-channel transistor.

13. The circuit of claim 9, wherein the third switch is a p-channel transistor.

14. The circuit of claim 9, wherein the fourth switch is a p-channel transistor.

15. The circuit of claim 9, wherein the fifth switch is an n-channel transistor.

16. The circuit of claim 9, wherein the sixth switch is an n-channel transistor.

17. The circuit of claim 9, further comprising a cascode circuit coupled with the outputs of the second and sixth switches.

18. The circuit of claim 9, wherein the first voltage level is approximately 2.5 volts the second voltage level is approximately 3.3 volts.

* * * * *